US00RE44538E

(19) United States
(12) Reissued Patent
Redwing et al.

(10) Patent Number: US RE44,538 E
(45) Date of Reissued Patent: Oct. 15, 2013

(54) INDIUM GALLIUM NITRIDE CHANNEL HIGH ELECTRON MOBILITY TRANSISTORS, AND METHOD OF MAKING THE SAME

(75) Inventors: Joan M. Redwing, State College, PA (US); Edwin L. Piner, Phoenix, AZ (US)

(73) Assignee: Cree, Inc., Durham, NC (US)

(21) Appl. No.: 11/211,122

(22) Filed: Aug. 24, 2005

Related U.S. Patent Documents

Reissue of:
(64) Patent No.: 6,727,531
Issued: Apr. 27, 2004
Appl. No.: 09/633,598
Filed: Aug. 7, 2000

(51) Int. Cl.
*H01L 29/66* (2006.01)

(52) U.S. Cl.
USPC ..... 257/194; 257/20; 257/22; 257/24; 257/192; 257/201; 257/615; 257/745; 257/E29.246

(58) Field of Classification Search
USPC ..... 257/20, 22, 24, 1, 92, 194, 615, 745, 257/15, 27, 76, 190, 192, 201, 284, 972, 257/E29.246
See application file for complete search history.

(56) References Cited

U.S. PATENT DOCUMENTS 5,028,968 A * 7/1991 O'Loughlin et al. ..... 357/16
5,192,987 A 3/1993 Khan et al.
5,270,798 A * 12/1993 Pao et al. ..... 257/134
5,296,395 A 3/1994 Khan et al.
5,448,084 A * 9/1995 Hoke et al. ..... 257/190
5,625,202 A 4/1997 Chai
5,668,387 A * 9/1997 Streit et al. ..... 257/192
5,670,798 A * 9/1997 Schetzina ..... 257/96
5,821,576 A 10/1998 Sriram
5,856,217 A 1/1999 Nguyen et al.
5,929,467 A 7/1999 Kawai et al.
5,939,733 A 8/1999 Sato
5,960,018 A * 9/1999 Jewell et al. ..... 372/45
6,172,382 B1 * 1/2001 Nagahama et al. ..... 257/94
6,465,814 B2 10/2002 Kasahara et al.
6,727,531 B1 * 4/2004 Redwing et al. ..... 257/194

FOREIGN PATENT DOCUMENTS

DE 19613265 4/1997
JP 09307097 11/1997
JP 11-162848 A 6/1999

(Continued)

OTHER PUBLICATIONS

Islam, S.K., Jain, F.C., Zhao, G., Heller, E., *Int. J. Infrared and Millimeter Waves,* 19(12), 1633-1647 (1998).

(Continued)

*Primary Examiner* — Mark Prenty
(74) *Attorney, Agent, or Firm* — Vincent K. Gustafson; Jenkins, Wilson, Taylor & Hunt, P.A.

(57) ABSTRACT

A gallium nitride-based HEMT device, comprising a channel layer formed of an InGaN alloy. Such device may comprise an AlGaN/InGaN heterostructure, e.g., in a structure including a GaN layer, an InGaN layer over the GaN layer, and a (doped or undoped) AlGaN layer over the InGaN layer. Alternatively, the HEMT device of the invention may be fabricated as a device which does not comprise any aluminum-containing layer, e.g., a GaN/InGaN HEMT device or an InGaN/InGaN HEMT device.

13 Claims, 2 Drawing Sheets

(56) References Cited

FOREIGN PATENT DOCUMENTS

| | | |
|---|---|---|
| JP | 11-261053 | 9/1999 |
| JP | 11-274474 | * 10/1999 |
| JP | 2000196067 | 7/2000 |

OTHER PUBLICATIONS

Maeda, N., Saitoh, T., Tsubaki, K., Nishida, T., Kobayashi, N., *Jpn. J. Appl. Phys.,* 38, L799-L801 (1999).
Imanaga, S., Kawai, H., *J. Appl. Phys.,* 83(11), 5843-5858 (1997).
Imanaga, S., Kawai, H., *J. Cryst. Growth,* 189/190, 742-748 (1998).
Wu, Y.-F., Keller, B.P., Keller, S., Xu, J.J., Thibeault, B.J., Denbaars, S.P., Mishra, U.K., *IEICE Trans. Electron,* E82-C(11), 1895-1905 (1999).
Ambacher, O., Dimitrov, R., Stutzmann, M., Foutz, B., Murphy, M., Smart, J., Shealy, J.R., Weimann, N.G., Eastman, L.F., *Inst. Phys. Conf,* 166, Chapter 7, p. 493-497 (2000).
English translation of Feb. 27, 2012 Official Action in Japanese Patent Application No. 2002-518532 Based on International Patent Application No. PCT/US01/23052.
M.D. McCluskey, N.M. Johnson, C.G. Van De Walle, D.P. Bour, M. Kneissl and W. Walukiewicz; Mat. Res. Soc. Symp. Proc. 521 (1998), p. 531.
J.Z. Li, et al, J. Appl. Phys. 82, (1997), 1227.
T.L. Tansley and C.P. Foley, Electron. Lett., 20, (1984), 1066.
S. Yamaguchi, et al., J. Appl. Phys. 85, (1999), p. 7682, "Structural properties of InN on GaN grown by metalorganic vapor phase epitaxy".
B. Foutz, et al., J. Appl. Phys. 85, (1999), p. 7727, "Transient electron transport inwurtzite GaN, InN and AIN".

* cited by examiner

INDIUM GALLIUM NITRIDE CHANNEL HIGH ELECTRON MOBILITY TRANSISTORS, AND METHOD OF MAKING THE SAME

Matter enclosed in heavy brackets [ ] appears in the original patent but forms no part of this reissue specification; matter printed in italics indicates the additions made by reissue.

GOVERNMENT RIGHTS IN INVENTION

The invention was made in the performance of the U.S. Army Space and Missile Defense Command, Contract Number DASG60-98-C-0025. The government has certain rights in the invention.

BACKGROUND OF THE INVENTION

1. Field of the Invention

This invention relates to high electron mobility transistor (HEMT) devices and method of making the same.

2. Description of the Related Art

GaN based materials have physical and electronic properties that make them attractive for high temperature, high power and high frequency devices. Wide bandgap semiconductors (GaN and SiC) have inherently lower thermal carrier generation rates and higher breakdown fields compared to Si and GaAs, as shown in Table 1 below.

TABLE 1

Properties of candidate materials for high power, high temperature, high frequency electronic devices

| Material Property | Si | GaAs | 4H-SiC | GaN |
|---|---|---|---|---|
| Bandgap (eV) | 1.1 | 1.4 | 3.3 | 3.4 |
| Breakdown field ($10^5$ V/cm) | 2 | 4 | 30 | 30? |
| Electron mobility ($cm^2$/Vs) | 1400 | 8500 | 800 | 900[a], 2000[b] |
| Maximum velocity ($10^7$ cm/s) | 1 | 2 | 2 | 3 |
| Thermal conductivity (W/cm K) | 1.5 | 0.5 | 4.9 | 1.3 |

[a]for n = 5E16 $cm^{-3}$;
[b]for an AlGaN/GaN structure

GaN has additional advantages including a high (>800 $cm^2$/Vs) electron mobility and a high (>$10^7$ cm/sec) electron velocity. Furthermore, high electron mobility transistors (HEMTs) which offer higher mobilities, better charge confinement and higher breakdown voltages can be fabricated in the AlGaN/GaN materials system. Room temperature radio frequency (8-10 GHz) output powers on the order of 6-8 W/mm are theoretically possible in the AlGaN/GaN materials system and power densities as high as 6.8 W/mm have recently been reported (S. T. Sheppard, et al., 56$^{th}$ Device Research Conference, Charlottesville, Va., Jun. 22-24, 1998).

While promising output powers have been reported in AlGaN/GaN HEMTs, materials-related issues continue to limit device performance. Persistent photoconductivity (PPC) and drain I-V collapse have been reported in AlGaN alloys (M. D. McCluskey, N. M. Johnson, C. G Van De Walle, D. P. Bour, M. Kneissl and W. Walukiewicz, Mat. Res. Soc. Symp. Proc. 521 (1998), p. 531) and AlGaN/GaN heterostructures (J. Z. Li, J. Y. Lin, H. X. Jiang, M. A. Khan and Q. Chen, J. Appl. Phys. 82 (1997) 1227). These effects arise from carrier trapping and generation from deep levels in the material and can lead to poor high frequency performance, decreased drain currents and reduced output powers in a HEMT. PPC and current collapse in GaAs-based HEMTs have been attributed to defect-donor complexes (DX centers) in $Al_xGa_{1-x}As$ when x>0.20. Evidence for oxygen DX-centers in Al-rich $Al_xGa_{1-x}N$ (x>0.27) has recently been reported (M. D. McCluskey, et al., ibid.). High Al content AlGaN layers (x>0.20) are commonly used to achieve high sheet densities in AlGaN/GaN HEMT structures via piezoelectric-induced doping as shown by the data in FIG. 1, which is a plot of sheet density as a function of percent aluminum composition in undoped 23 nanometer AlGaN/GaN heterostructures.

In order to further improve the performance of III-V nitride HEMTs, methods must be identified to reduce or eliminate the deleterious effects of deep level defects that result from the use of high Al composition layers.

SUMMARY OF THE INVENTION

The present invention relates in one aspect thereof to a gallium nitride-based HEMT device, comprising a channel layer formed of an InGaN alloy.

Such device may comprise an AlGaN/InGaN heterostructure, e.g., in a structure including a GaN layer, an InGaN layer over the GaN layer, and an AlGaN layer over the InGaN layer. The AlGaN layer may be doped or undoped, as necessary or desired in a given end use application of the HEMT.

Alternatively, the HEMT device of the invention may be fabricated as a device which does not comprise any aluminum-containing layer, e.g., a GaN/InGaN HEMT device or an InGaN/InGaN HEMT device.

In another aspect, the invention relates to a method of fabricating a GaN-based HEMT device, comprising forming a channel layer for the device of an InGaN alloy.

Other aspects, features and embodiments of the invention will be more fully apparent from the ensuing disclosure and appended claims.

DETAILED DESCRIPTION OF THE INVENTION, AND PREFERRED EMBODIMENTS THEREOF

In accordance with the present invention, the performance of GaN-based HEMTs is improved by use of InGaN alloys in the channel layer of the device.

The use of InGaN alloys in the channel layer of HEMT devices has been discovered to permit substantially lower Al composition AlGaN layers to be employed at equivalent levels of strain and piezoelectric doping characteristic of AlGaN/GaN heterostructures.

InGaN provides a large a-lattice constant in relation to GaN (the a-lattice constant difference between GaN and InN is 0.351 Å, compared to a 0.079 Å difference between GaN and AlN), and low Al and In content layers can be used to produce pseudomorphic AlGaN/InGaN heterostructures with comparable strain to AlGaN/GaN. For example, the lattice mismatch of an $Al_{0.10}Ga_{0.90}N/In_{0.046}Ga_{0.954}N$ interface is identical to that of $Al_{0.30}G_{0.70}N$/GaN. Consequently, it is possible to produce AlGaN/InGaN heterostructures that enable the use of reduced Al content AlGaN layers without significant reductions in piezoelectric-induced doping or degradation of the structural or electrical properties of the channel layer.

In addition to a reduction in DX-center related transient effects, the use of low Al content AlGaN layers in the HEMT enables reduced ohmic contact resistance to be achieved.

The high electron mobility of InN (4000 $cm^2/Vs$ for $n=1E16\ cm^{-3}$) in relation to GaN permits the use of InGaN alloys in the channel layer of the device to achieve significant improvements in electrical properties and device performance.

Figure 1:
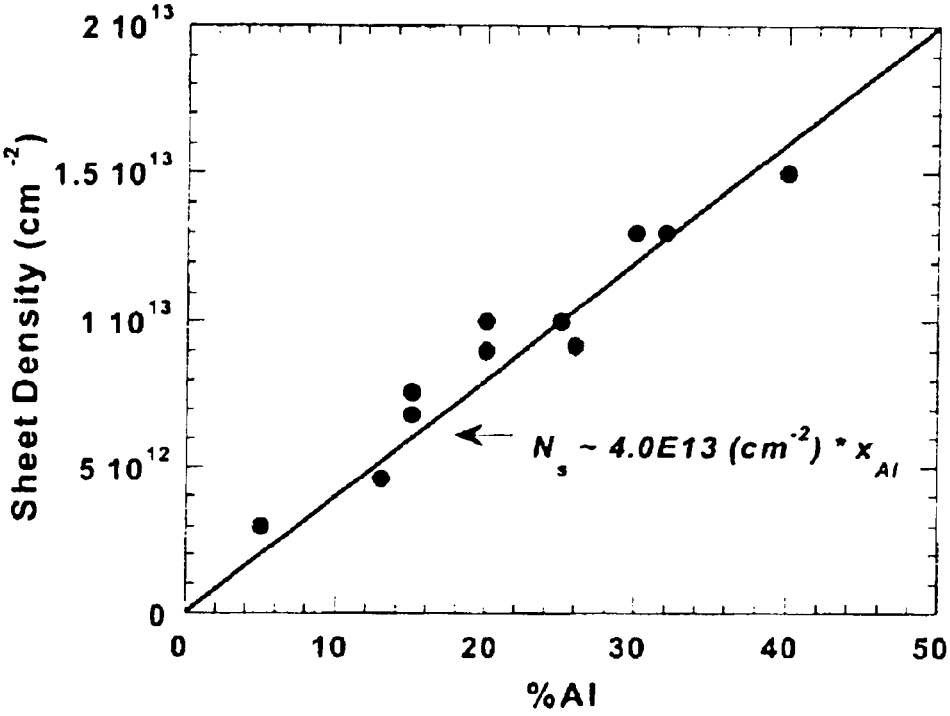
FIG. 1 is a plot of sheet density versus % Al in undoped 23 nm AlGaN/GaN heterostructures, showing that piezoelectric-induced doping results in an increase in sheet density with increasing Al composition.
Figure 2:
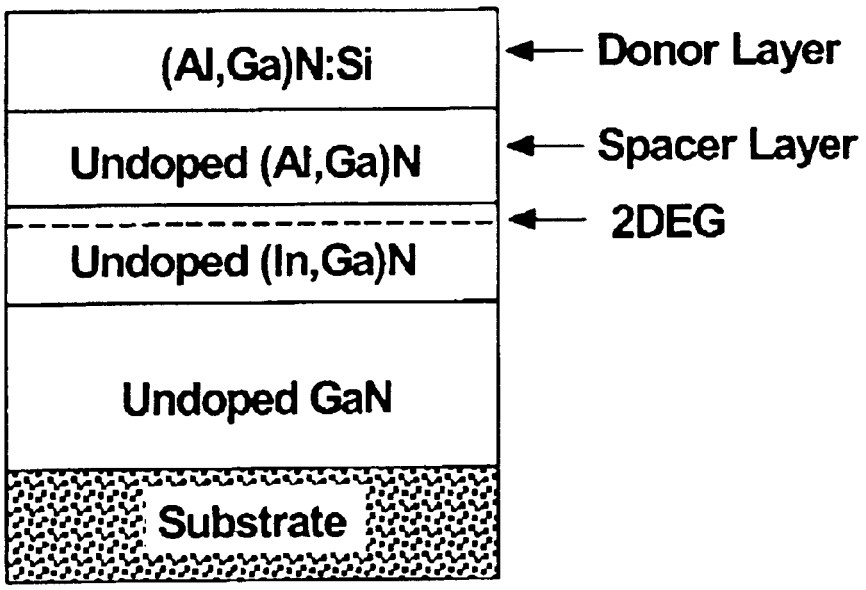
FIG. 2 is a schematic representation of an AlGaN/InGaN HEMT structure.
Figure 3:
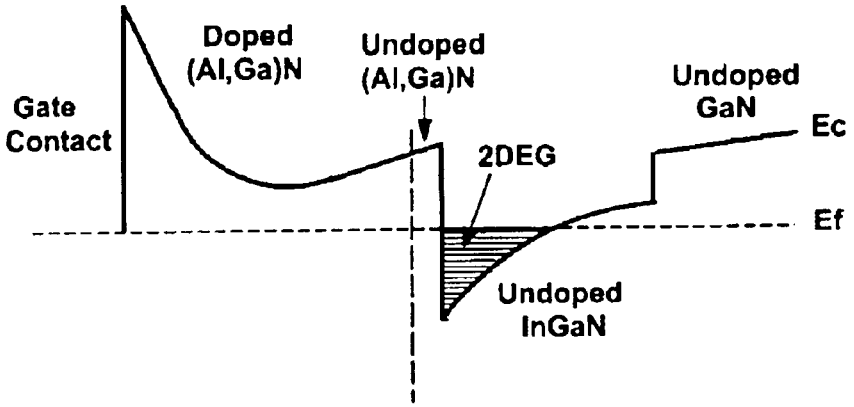
FIG. 3 is a band diagram of an AlGaN/InGaN HEMT structure.

FIG. 2 is a schematic representation of an AlGaN/InGaN HEMT structure for an illustrative device according to the present invention. In the fabrication of this device, a pseudomorphic AlGaN layer is grown on top of an InGaN layer overlying a GaN layer, using appropriate growth conditions readily determinable without undue experimentation by those of ordinary skill in the art. The InGaN layer should be thick enough so that it is "relaxed" in the multilayer structure. Typical thicknesses in various embodiments of the invention may include thicknesses of the InGaN layer in the range of from about 100 to about 5,000 nanometers, with more specific thicknesses in some instances being in the range of from about 200 to about 2,000 nanometers, or in a narrower range of from about 400 to about 1,000 nanometers.

Alternatively, the InGaN layer can be grown directly on the substrate (including a buffer layer). The AlGaN layer can be undoped or the upper or top-most portion of the AlGaN can be doped to further increase the sheet density.

Alternatively, an InGaN channel HEMT can be fabricated using GaN or InGaN on InGaN. In this case, chemically reactive Al-containing layers are completely eliminated from the device structure, to provide a GaN/InGaN HEMT with improved long-term stability and reliability characteristics under high power operation than are achievable by an AlGaN/GaN HEMT or an AlGaN/InGaN HEMT. Additionally, an InGaN/InGaN HEMT provides fabricational advantages due to the differing optimum growth conditions between InGaN, and AlGaN or GaN.

The growth of the indium gallium nitride layers in the practice of the invention may be effected by any suitable process or technique therefor. For example, such layers may be formed by vapor phase techniques in which reactant gas species (e.g., ammonia, trimethylgallium, and trimethylindium) enter a growth reactor that contains the substrate. The reactant gas species passes over the substrate depositing an epitaxial film of said species (i.e., nitrogen from ammonia, gallium from trimethylgallium, and indium from trimethylindium). The InGaN process may occur at temperatures in the range of from about 500 to 1000° C., with a more specific temperature range of from about 700 to 950° C., or in a narrower temperature range of from about 800 to 900° C. The pressure of the reactor may be maintained in the range of from about 50 to 980 mbarr. The indium-to-gallium ratio may be anywhere in the range of from 0 to 100%.

The features, aspects and advantages of the present invention are further shown with reference to the following non-limiting examples relating to the invention.

EXAMPLE 1

| |
|---|
| (Al,Ga)N:Si |
| Undoped (Al,Ga)N |
| Undoped (In,Ga)N |
| Undoped GaN |
| Substrate |

Example of the Fabrication of an HEMT Structure of the Type Shown in FIG. 2

A HEMT structure of the design shown in Example 1 comprises a suitable substrate for depositing GaN; an unintentionally doped GaN layer as a buffer over said substrate; an unintentionally doped InGaN channel layer over said GaN buffer layer that is relaxed with respect to strain due to the different lattice constants of the said GaN buffer layer and the InGaN channel layer; an unintentionally doped AlGaN spacer layer over said InGaN channel layer; an intentionally silicon-doped AlGaN donor layer over said AlGaN spacer layer.

EXAMPLE 2

| |
|---|
| Undoped (In,Ga)N |
| Buffer Laver |
| Substrate |

Example of the Fabrication of the InGaN Layer Being Formed Directly on a Substrate, With a Buffer Layer An InGaN structure of the design shown in Example 2 comprises a suitable substrate for depositing GaN; a buffer layer over said substrate; an unintentionally doped InGaN layer over said buffer layer.

EXAMPLE 3

| |
|---|
| GaN:Si |
| Undoped GaN |
| Undoped (In,Ga)N |
| Undoped GaN |
| Substrate |

Example of the Fabrication of a GaN/InGaN HEMT Device

A HEMT structure of the design shown in Example 3 comprises a suitable substrate for depositing GaN; an unintentionally doped GaN layer as a buffer over said substrate; an unintentionally doped InGaN channel layer over said GaN buffer layer that is relaxed with respect to strain due to the different lattice constants of the said GaN buffer layer and the InGaN channel layer; an unintentionally doped GaN spacer layer over said InGaN channel layer; an intentionally silicon-doped GaN donor layer over said AlGaN spacer layer.

EXAMPLE 4

| |
|---|
| (In,Ga)N:Si |
| Undoped (In,Ga)N |
| Undoped (In,Ga)N |
| Undoped GaN |
| Substrate |

Example of the Fabrication of an InGaN/InGaN HEMT Device

A HEMT structure of the design shown in Example 4 comprises a suitable substrate for depositing GaN; an unintentionally doped GaN layer as a buffer over said substrate; an unintentionally doped InGaN channel layer over said GaN buffer layer that is relaxed with respect to strain due to the different lattice constants of the said GaN buffer layer and the InGaN channel layer; an unintentionally doped InGaN spacer layer that has a lower InN concentration compared to the InGaN channel layer over said InGaN channel layer; an intentionally silicon-doped InGaN donor layer over said InGaN spacer layer that has the same InN concentration as the InGaN spacer layer. In this example, the channel comprising the high density of charged carriers is formed at or near the interface between the InGaN channel layer and InGaN spacer layer due to the piezoelectric-induced doping as a result of the strain associated with the differing InN concentrations of the InGaN channel layer and InGaN spacer layer.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art. The invention therefore is to be broadly construed, consistent with the claims hereafter set forth.

What is claimed is:

[1. A gallium nitride-based HEMT device, comprising a channel layer comprising an InGaN alloy and at least one additional layer over said channel layer, wherein said at least one additional layer comprises material selected from the group consisting of GaN and InGaN, and wherein said device does not comprise an aluminum-containing layer.]

[2. A gallium nitride-based HEMT device, comprising a channel layer comprising an InGaN alloy and at least one additional layer directly over said channel layer, wherein said at least one additional layer comprises GaN material, forming a GaN/InGaN HEMT with the channel layer.]

[3. A gallium nitride-based HEMT device, comprising a channel layer comprising an InGaN alloy and at least one additional layer directly over said channel layer, wherein said at least one additional layer comprises InGaN material, forming an InGaN/InGaN HEMT with the channel layer.]

4. A gallium nitride based HEMT device, comprising a channel layer comprising an InGaN alloy and at least one additional layer over said channel layer, wherein said at least one additional layer comprises $Al_xGa_{1-x}N$ material, [and] wherein x is about 0.1, *and wherein said $Al_xGa_{1-x}N$ material is not intentionally doped.*

[5. A gallium nitride-based HEMT device, comprising:

a substrate;

a GaN buffer layer on said substrate;

a channel layer on said GaN buffer layer, said channel comprising an InGaN alloy;

at least one additional layer on said channel layer, said at least one additional layer comprising undoped GaN material and forming a GaN space layer; and a doped GaN doner layer on said GaN spacer layer.]

[6. A gallium nitride-based HEMT device, comprising:

a substrate;

a GaN buffer layer on said substrate;

a channel layer on said GaN buffer layer, said channel layer comprising an InGaN alloy;

at least one additional layer on said channel layer, said at least one additional layer comprising undoped InGaN material and forming an InGaN spacer layer; and a doped InGaN donor layer on said InGaN spacer layer, wherein said InGaN spacer layer has a lower InN concentration than said channel layer.]

*7. A gallium nitride based HEMT device, comprising a channel layer comprising an InGaN alloy and at least one additional layer over said channel layer, wherein said at least one additional layer comprises $Al_xGa_{1-x}N$ material wherein x is about 0.1, and wherein the channel layer has a thickness in a range of from about 100 nanometers to about 5000 nanometers.*

*8. A gallium nitride based HEMT device, comprising a channel layer comprising an InGaN alloy and at least one additional layer over said channel layer, wherein said at least one additional layer comprises $Al_xGa_{1-x}N$ material wherein x is about 0.1, and wherein the at least one additional layer further comprises an AlGaN spacer layer between the channel layer and said at least one additional layer.*

*9. The HEMT device of claim 4, further comprising a GaN layer below said channel layer.*

*10. The HEMT device of claim 7, wherein said $Al_xGa_{1-x}N$ material is not intentionally doped.*

*11. The HEMT device of claim 7, wherein said at least a portion of the $Al_xGa_{1-x}N$ material is intentionally doped to provide an increased sheet density in relation to a corresponding undoped AlGaN layer.*

*12. The HEMT device of claim 7, wherein the channel layer has a thickness in a range of from about 200 nanometers to about 2000 nanometers.*

*13. The HEMT device of claim 7, wherein the channel layer has a thickness in a range of from about 400 nanometers to about 1000 nanometers.*

*14. The HEMT device of claim 4, further comprising a substrate and a buffer layer on said substrate, wherein said channel layer is disposed over said buffer layer.*

*15. The HEMT device of claim 7, further comprising a GaN layer below said channel layer.*

*16. The HEMT device of claim 7, further comprising a substrate and a buffer layer on said substrate, wherein said channel layer is disposed over said buffer layer.*

*17. The HEMT device of claim 8, further comprising a GaN layer below said channel layer.*

*18. The HEMT device of claim 8, further comprising a substrate and a buffer layer on said substrate, wherein said channel layer is disposed over said buffer layer.*

* * * * *